(12) United States Patent
Shang et al.

(10) Patent No.: US 8,611,054 B1
(45) Date of Patent: Dec. 17, 2013

(54) ANTIFERROMAGNETICALLY-COUPLED SOFT BIAS MAGNETORESISTIVE READ HEAD, AND FABRICATION METHOD THEREFORE

(75) Inventors: Changhe Shang, Fremont, CA (US); Daniele Mauri, San Jose, CA (US); Kuok San Ho, Emerald Hills, CA (US); Anup G. Roy, Fremont, CA (US); Ming Mao, Dublin, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/444,723

(22) Filed: Apr. 11, 2012

(51) Int. Cl.
*G11B 5/39* (2006.01)

(52) U.S. Cl.
USPC .................................................. 360/324.12

(58) Field of Classification Search
USPC .................................................. 360/324.12
See application file for complete search history.

(56) References Cited

U.S. PATENT DOCUMENTS

| | | | |
|---|---|---|---|
| 5,434,826 A | 7/1995 | Ravipati et al. | |
| 6,421,212 B1 | 7/2002 | Gibbons et al. | |
| 6,466,418 B1 | 10/2002 | Horng et al. | |
| 6,944,939 B2 | 9/2005 | Guo et al. | |
| 7,016,166 B1 | 3/2006 | Hou et al. | |
| 7,126,797 B2 | 10/2006 | Hasegawa et al. | |
| 7,130,165 B2 | 10/2006 | Macken et al. | |
| 7,155,810 B2 | 1/2007 | Pinarbasi | |
| 7,212,384 B1 | 5/2007 | Stoev et al. | |
| 7,229,706 B2 | 6/2007 | Hasegawa et al. | |
| 7,268,985 B2 | 9/2007 | Freitag et al. | |
| 7,275,304 B2 | 10/2007 | Sakai et al. | |
| 7,301,734 B2 | 11/2007 | Guo et al. | |
| 7,446,987 B2 | 11/2008 | Zhang et al. | |
| 7,468,870 B2 | 12/2008 | Arasawa et al. | |
| 7,515,388 B2 | 4/2009 | Zhang et al. | |
| 7,580,230 B2 | 8/2009 | Freitag et al. | |
| 7,599,158 B2 | 10/2009 | Wang et al. | |
| 7,639,457 B1 | 12/2009 | Chen et al. | |
| 7,675,718 B2 | 3/2010 | Chang et al. | |
| 7,804,668 B2 | 9/2010 | Zhou et al. | |
| 7,848,065 B2 | 12/2010 | Freitag et al. | |
| 7,898,776 B2 | 3/2011 | Nakabayashi et al. | |
| 8,011,084 B2 | 9/2011 | Le et al. | |
| 2003/0189802 A1* | 10/2003 | Morinaga et al. | 360/324.12 |
| 2004/0075960 A1* | 4/2004 | Li et al. | 360/324.12 |
| 2005/0275975 A1 | 12/2005 | Zhang et al. | |
| 2006/0114622 A1* | 6/2006 | Gill | 360/324.12 |

* cited by examiner

*Primary Examiner* — Will J Klimowicz

(57) ABSTRACT

A magnetic read transducer is described with a magnetoresistive sensor that has a free layer, and an antiferromagnetically-coupled (AFC) soft bias layer for magnetically biasing the free layer. The free layer has a first edge in a track width direction along an air-bearing surface (ABS). At least a portion of the AFC soft bias layer is conformal to at least a portion of a second edge of the free layer, and situated to form a magnetic moment at an angle with respect to a center line of the free layer. The center line of the free layer extends in the same direction as the free layer first edge that is in the track width direction along the ABS.

25 Claims, 7 Drawing Sheets

US 8,611,054 B1

ANTIFERROMAGNETICALLY-COUPLED SOFT BIAS MAGNETORESISTIVE READ HEAD, AND FABRICATION METHOD THEREFORE

FIELD

The invention relates generally to the field of magnetic recording systems. More specifically, embodiments of the present invention pertain to improving stability of a magnetic reader, and a fabrication method therefore.

BACKGROUND

Magnetic storage systems, such as a hard disk drive (HDD), are utilized in a wide variety of devices in both stationary and mobile computing environments. Examples of devices that incorporate magnetic storage systems include desktop computers, portable notebook computers, portable hard disk drives, digital versatile disc (DVD) players, high definition television (HDTV) receivers, vehicle control systems, cellular or mobile telephones, television set top boxes, digital cameras, digital video cameras, video game consoles, and portable media players.

A typical HDD includes magnetic storage media of one or more flat disks. The disks are generally formed of two main substances, namely, a substrate material that gives it structure and rigidity, and a magnetic media coating that holds the magnetic impulses or moments that represent data. A HDD also typically includes a read head and a write head, generally a magnetic transducer which can sense and/or change the magnetic fields stored on the disks. Perpendicular magnetic recording (PMR) involves recorded bits that are stored in a generally planar recording layer in a generally perpendicular or out-of-plane orientation. A PMR read head and a PMR write head are usually formed as an integrated read/write head on an air-bearing slider. In a PMR reader, a tunnel magnetoresistance (TMR) sensor is frequently employed in the read head.

A TMR sensor includes a patterned TMR structure or stack having two ferromagnetic layers separated by an insulating barrier layer (e.g., MgO). One ferromagnetic layer is magnetically oriented in a fixed direction (the "pinned layer") and the other ferromagnetic layer rotates in response to an external magnetic field (the "free layer"). The TMR sensor also typically includes a hard bias layer disposed on either side of the TMR stack. The hard bias layer includes a permanent magnetic material, such as cobalt platinum (CoPt), and provides a bias field along a direction perpendicular to layers of the TMR stack. The resistance of the device is dependent on the relative orientation between the two ferromagnetic layers. In a TMR read head, a sense current passes perpendicularly through layers of the TMR stack. The magnetic transitions between adjacent oppositely-directed magnetized regions cause changes in electrical resistance that are detected by the TMR sensor.

The amplitude of a readback signal of a PMR reader can be asymmetric. Readback signal amplitude asymmetry indicates that the amplitude of the pulses from magnetizations recorded in one direction (e.g., the "positive" direction) is different from the amplitude of the pulses from magnetizations recorded in the opposite direction (e.g., the "negative" direction). The amplitude asymmetry (AASY) measured in percent may be expressed as $[(S_P - S_N)/(S_P + S_N)]*100$, where $S_P$ represents the measured amplitude of the pulses from magnetizations recorded in one direction and $S_N$ represents the measured amplitude of the pulses from magnetizations recorded in the other direction. A high value of AASY is undesirable since it has a deleterious effect on the stability of the read head by causing a high bit error rate (BER) when the data is read back. AASY is partly a result of the construction of the reader. Spurious magnetic fields arising from the media background and other sources also contribute to amplitude asymmetry. There is a current demand for increasing track density, requiring decreasing reader track width. However, as reader track width is decreased, de-magnetic fields rapidly increase, and the increased de-magnetic field in turn causes reader stability degradation by increasing the AASY.

Conventionally, in an effort to improve reader stability, the thickness of the hard bias layer is increased. However, with increasing track density, there is a requirement to reduce a shield-to-shield spacing for the TMR sensor stack. Therefore, it is often neither desirable nor practical to increase the hard bias layer thickness to improve the AASY. In addition, an increase in the hard bias thickness causes a significant reduction in the reader amplitude.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein.

DETAILED DESCRIPTION

Figure 1:
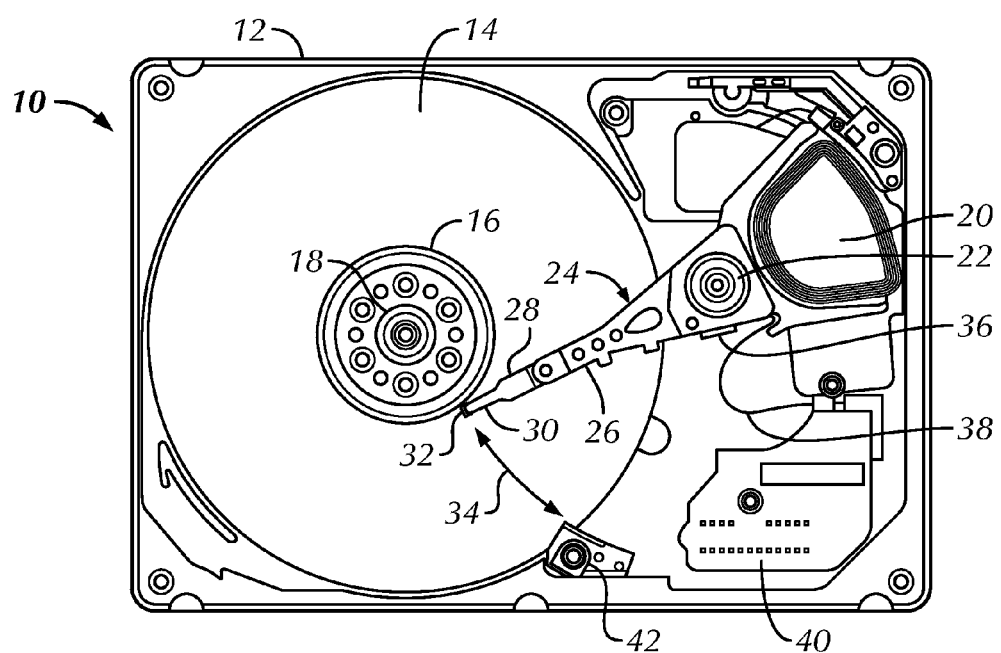
FIG. 1 is a top plan view of a disk drive data storage system in which embodiments of the present invention are useful.

Exemplary embodiments are described with reference to specific configurations. Those of ordinary skill in the art will appreciate that various changes and modifications can be made while remaining within the scope of the appended claims. Additionally, well-known elements, devices, components, methods, process steps and the like may not be set forth in detail in order to avoid obscuring the invention.

Stabilizing read heads by magnetically biasing a sensor layer with a hard bias structure presents problems and limitations, especially with the current demand for increased density in magnetic recording devices. Most hard bias materials have a granular polycrystalline microstructure with various crystalline orientations or spontaneous magnetization directions for different grains. Even following a high field initialization of the hard bias material of about 1 Tesla, local field diversity remains. This microscopic variation becomes increasingly detrimental when sensor sizes are reduced to similar dimensions as hard bias grains, for example, tens of nanometers as needed for ultra-high areal density magnetic recording. The local field variation can lead to operation of the free layer at different bias points, thus exhibiting a high asymmetry sigma, as further described below with reference to FIG. 6.

High coercivity in permanent magnetic materials (greater than 2,000 Oe) causes the hard bias material to be rigid or irresponsive to an external magnetic field. This acts as magnetic interference gaps left at the sides of a free layer. In order to avoid or reduce the magnetic interference from the nearby bit domains for ultra-high areal density recording, the free layer may be magnetically shielded on all sides by a soft magnetic material, using, for example, a top and bottom shield design. The hard bias stabilized read head does not provide a side shielding effect such as with soft magnetic materials (e.g., NiFe or CoFe). Moreover, hard bias materials such as CoPt and FePt are currently a greater expense than soft magnetic materials such as NiFe and CoFe. Processing of hard bias materials or permanent magnetic materials also requires the use of expensive tools.

An apparatus, system and method are described herein for improving the stability of a magnetic reader for a magnetic recording system. A magnetoresistive sensor is stabilized for a magnetic read transducer by utilizing a conformal antiferromagnetically-coupled (AFC) soft bias structure as described herein. Embodiments of the invention exhibit a consistently low and desirable AASY across a stripe height range, and proper reader amplitude, which is useful to meet demands of increased areal density recording. Additionally, embodiments of the AFC soft bias structure facilitate variation of reader amplitude. Further, embodiments of the AFC soft bias structure provide a higher QSNR capability and reverse overwrite than contemporary hard bias designs. Moreover, the embodiments of the AFC soft bias structure can utilize readily available and lesser priced soft ferromagnetic materials such as NiFe and CoFe.

It will be apparent that the apparatus, system and methods disclosed within this discussion and claims may be utilized with disk drive memory systems, and other memory systems utilizing a magnetic reading device.

Referring to the drawings wherein identical reference numerals denote the same elements throughout the various views, FIG. 1 illustrates a disk drive storage system 10, in which embodiments of the present invention are useful. Features of the discussion and claims are not limited to this particular design, which is shown only for purposes of the example. Disk drive 10 includes base plate 12 that may be disposed on a top cover forming a sealed environment to protect internal components from contamination. Disk drive 10 further includes one or more data storage disks 14 of computer-readable data storage media. Typically, both of the major surfaces of each data storage disk 14 include a plurality of concentrically disposed tracks for data storage purposes. Each data storage disk 14 is mounted on a hub or spindle 16, which in turn is rotatably interconnected with a base plate 12 and/or cover. Multiple data storage disks 14 are typically mounted in vertically spaced and parallel relation on the spindle 16. A spindle motor 18 rotates the data storage disks 14 at an appropriate rate.

The disk drive 10 also includes an actuator arm assembly 24 that pivots about a pivot bearing 22, which in turn is rotatably supported by the base plate 12 and/or cover. The actuator arm assembly 24 includes one or more individual rigid actuator arms 26 that extend out from near the pivot bearing 22. Multiple actuator arms 26 are typically disposed in vertically spaced relation, with one actuator arm 26 being provided for each major data storage surface of each data storage disk 14 of the disk drive 10. Other types of actuator arm assembly configurations may be utilized as well, such as an assembly having one or more rigid actuator arm tips or the like that cantilever from a common structure. Movement of the actuator arm assembly 24 is provided by an actuator arm drive assembly, such as a voice coil motor 20 or the like. The voice coil motor 20 is a magnetic assembly that controls the operation of the actuator arm assembly 24 under the direction of control electronics 40.

Figure 2:
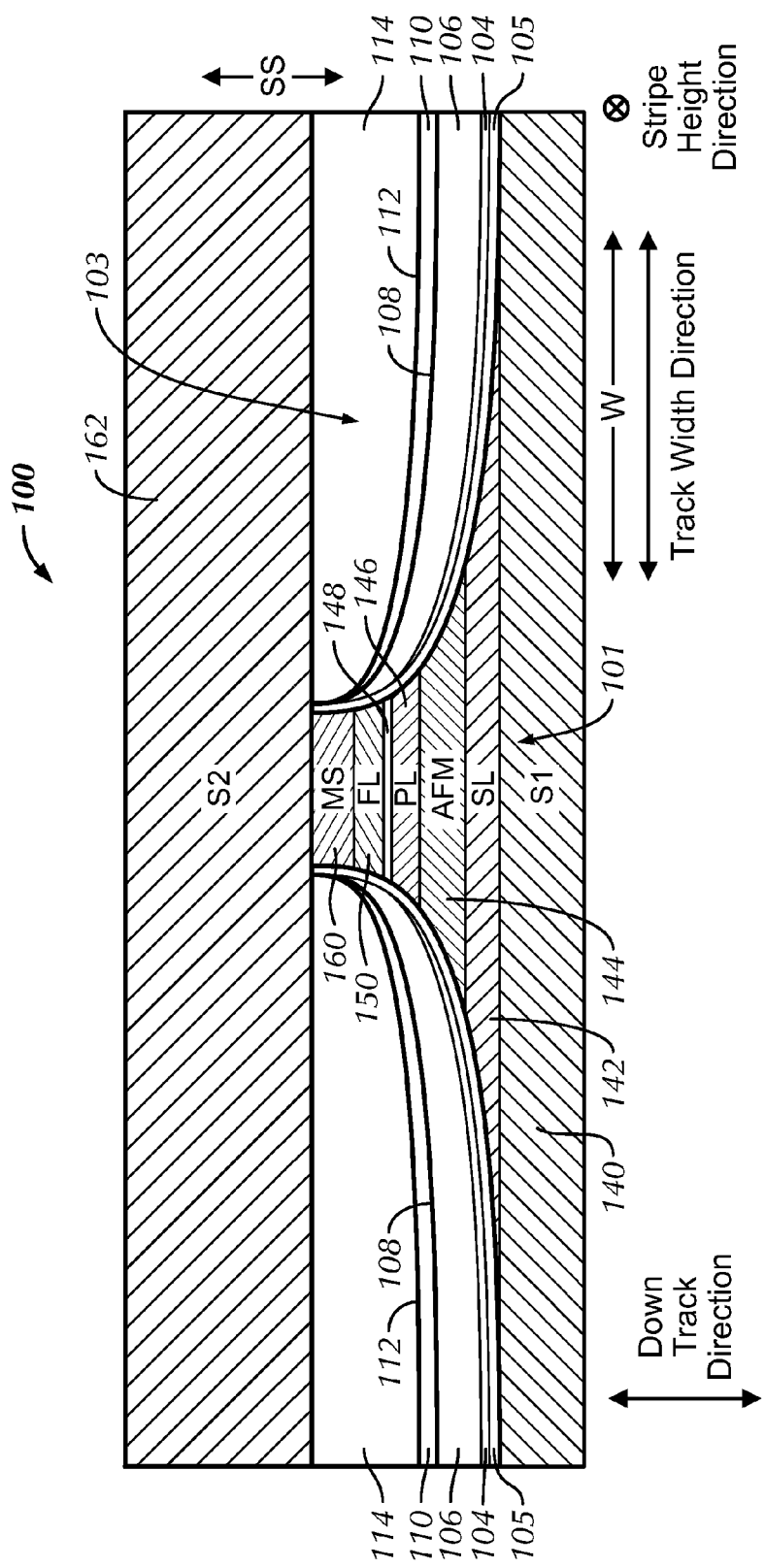
FIG. 2 is a sectional view of a portion of a magnetic recording read transducer, in an embodiment of the present invention, as can be used in a disk drive data storage system as in FIG. 1.

A suspension 28 is attached to the free end of each actuator arm 26 and cantilevers therefrom. The slider 30 is disposed at or near the free end of each suspension 28. What is commonly referred to as the read/write head (e.g., transducer) is mounted as a head unit 32 under the slider 30 and is used in disk drive read/write operations. As the suspension 28 moves, the slider 30 moves along arc path 34 and across the corresponding data storage disk 14 to position the head unit 32 at a selected position on the data storage disk 14 for the disk drive read/write operations. When the disk drive 10 is not in operation, the actuator arm assembly 24 may be pivoted to a parked position utilizing ramp assembly 42. The head unit 32 is connected to a preamplifier 36 via head wires routed along the actuator arm 26, which is interconnected with the control electronics 40 of the disk drive 10 by a flex cable 38 that is typically mounted on the actuator arm assembly 24. Signals are exchanged between the head unit 32 and its corresponding data storage disk 14 for disk drive read/write operations. A portion of the head unit 32 is shown in FIG. 2. The head unit 32 may utilize various types of read sensor technologies such as anisotropic magnetoresistive (AMR), giant magnetoresistive (GMR), tunneling magnetoresistive (TMR), other magnetoresistive technologies, or other suitable technologies.

FIG. 2 is an air-bearing surface (ABS) view of a portion of a magnetic recording read transducer, in an embodiment of the invention, as can be used with magnetic recording technology applications as in a disk drive data storage system as in FIG. 1. The illustrated read transducer 100 includes a tunneling magnetoresistive (TMR) sensor 101, and an antiferromagnetic-coupled soft bias (AFC SB) structure 103. The read transducer 100 may be part of a read head or alternatively may be part of a merged head that also includes a write transducer. Embodiments of the AFC SB structure invention may also be utilized with an anisotropic magnetoresistive (AMR) sensor, giant magnetoresistive (GMR) sensor, or be utilized with other magnetoresistive or suitable technologies.

The TMR stack 101 includes shields 140 and 162 (S1 and S2, respectively), seed layer 142 (SL), antiferromagnetic layer 144 (AFM), pinned layer 146 (PL), barrier 148 (e.g., MgO), free layer 150 (FL), and metal space layer 160 (MS). In addition, seed layer(s) may be used. Pinned layer 146 is a ferromagnetic layer that is magnetically oriented in a fixed direction, and free layer 150 is a ferromagnetic layer that rotates in response to an external magnetic field. The function layers of TMR stack 101 may include multiple layers. For example, the pinned layer 146 can be P1/Ru/P2, where P1 or P2 is NiFe and CoFe. Metal spacer layer 160 can be Ta, NiFe and CoFe. Shield 162 can be either a single material such as NiFe, or a laminated material such as NiFe/Ru/CoFe/AFM.

The AFC SB structure 103, for magnetically biasing the free layer 150, includes, in overlaying sequence, soft bias layer 106 (SB1), ruthenium 108 (Ru1), soft bias layer 110 (SB2), ruthenium 112 (Ru2), and soft bias layer 114 (SB3). The read transducer 100 may further include insulator 105 (INS) and AFC seed layer 104 (ASL). AFC seed layer 104 is situated between insulator 105 and soft bias layer 106 (SB1). AFC seed layer 104 is further situated with insulator 105 between pinned layer 146 and SB1, between antiferromagnetic layer 144 and SB1, between seed layer 142 (SL) and SB1, and between shield 140 and SB1, but AFC seed layer 104 is not situated between free layer 150 and SB1. In another embodiment, AFC seed layer 104 is further situated with insulator 105 between free layer 150 and SB1. A sacrificial cap may be utilized overlaying a portion of soft bias layer 114 (SB3) for chemical mechanical planarization (CMP), SB3 being micro structurally and magnetically coupled to top shield 162. Each layer of the AFC SB structure 103 can be a single material or multiple materials. In an embodiment, at least one of SB1, SB2, and SB3 is a CoFe-based soft magnetic material. In an example, SB1 and SB3 are nickel iron (NiFe), and SB2 is CoFe. In another example, SB1 and SB3 are multilayered with NiFe and cobalt iron (CoFe), and SB2 is CoFe. These soft ferromagnetic materials such as NiFe and CoFe are readily available and lesser priced than hard bias materials. In a further example, an additional CoFe soft bias material may be included between SB1 and Ru1 to enhance AF coupling. Yet another CoFe soft bias material may further be included between Ru2 and SB3 to enhance AF coupling.

In contemporary designs, the cross-track resolution of a free layer is primarily determined by the physical width (w) of the free layer. However, magnetic flux entering from the sides of the free layer can adversely impact cross-track resolution. That is, magnetic flux entering from the sides of the free layer may influence the ability of the free layer to accurately read data. The shields 140 and 162 may prevent some flux from reaching the sides of the free layer. However, as technologies scale to higher recording densities, the shield-to-shield spacing (shown as "SS") does not decrease sufficiently to address this issue.

The present invention AFC soft bias structure 103 is used to magnetically bias the free layer 150 in the track width direction, the track width direction as indicated in FIG. 2. The free layer 150 has a magnetization sensitive to an external magnetic field. Thus, the free layer 150 functions as a sensor layer for the magnetoresistive sensor 100. Consequently, as used herein free layer 150 is a sensor layer. If the sensor TMR stack 101 is used in a current perpendicular to plane (CPP) configuration, the insulator 105 may be used. Thus, current is driven in a direction substantially perpendicular to the plane of the layers 144, 146, 148, and 150. In a current parallel to plane (CIP) configuration, then conductive leads (not shown) may be provided on the AFC SB structure 103.

The free layer 150 has an edge in the track width direction along the ABS, as illustrated. The ABS of the read transducer is the surface that is exposed to magnetic flux from media. AFC soft bias structure 103 is conformal to a side edge of free layer 150, or alternatively to both side edges (shown as the left and right sides) of the free layer 150. The AFC soft bias structure 103 may alternatively be conformal to a portion of the side edges of free layer 150. When an insulator 105 is utilized between the AFC soft bias structure 103 and the free layer 150, the insulator 105 is conformal to the side edges of the free layer. In an embodiment, at least soft bias layer 106 (SB1) and soft bias layer 110 (SB2) have a substantially same slope as a facing edge of the free layer 150. The conformal AFC soft bias structure 103 maintains a uniform bias field across the free layer 150.

Although the AFC soft bias structure 103 is used and described herein to magnetically bias the free layer 150, embodiments of the present invention AFC soft bias structure may also be used to magnetically bias other ferromagnetic layers that may have a magnetic orientation that rotate in response to an external magnetic field.

Figure 3:
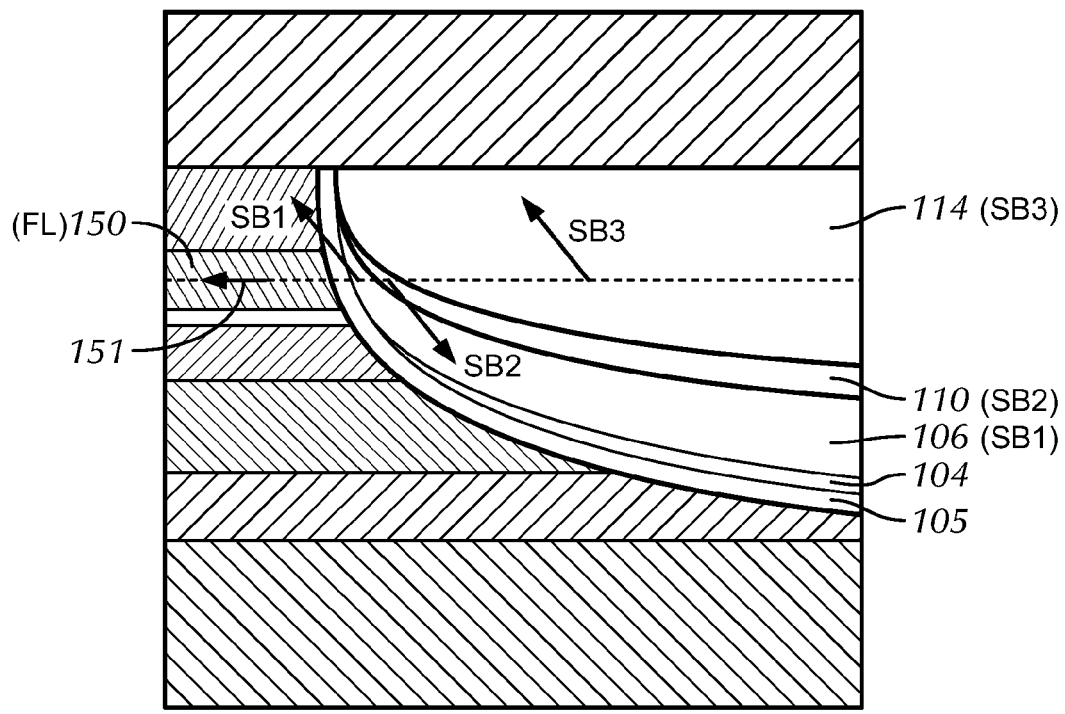
FIG. 3 is a sectional view of a portion of a magnetic recording read transducer as in FIG. 2, further illustrating magnetic moments of AFC soft bias layers with respect to a free layer center line, in an embodiment of the present invention.

FIG. 3 is another view of a portion of a magnetic recording read transducer as in FIG. 2, further illustrating magnetic moments of soft bias layers of AFC soft bias structure 103 with respect to center line 151 of free layer 150. The center line 151 of free layer 150 extends in the same direction as the edge of the free layer that is in the track width direction along the ABS. At least a portion of the AFC soft bias structure 103 is situated to form a magnetic moment at an angle with respect to the center line 151 of free layer 150. In an embodiment of the invention, soft bias layer 106 (SB1), soft bias layer 110 (SB2), and soft bias layer 114 (SB3) are situated to form a magnetic moment at an angle with respect to the center line 151 of free layer 150. Although the angles shown in FIG. 3 appear to be about 45 degrees, one layer, some layers, or all layers of the AFC soft bias structure 103 may be situated to form a magnetic moment at an appropriate angle up to about 90 degrees with respect to the free layer center line 151.

The AFC soft bias structure 103 is positioned at the side of the free layer 150 that extends in the stripe height direction. A second AFC soft bias structure may be utilized and positioned at the opposite side of the free layer 150 that also extends in the stripe height direction. The second AFC soft bias structure is also utilized to bias the free layer 150 by being situated to form a magnetic moment at an angle with respect to the center line 151 of free layer 150.

Figure 4:
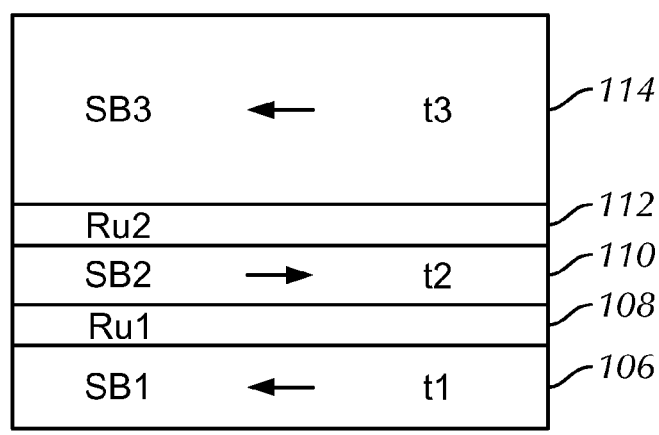
FIG. 4 is a sectional view of a representation of soft bias layer (SB) and ruthenium (Ru) layer thicknesses and magnetic moments of an AFC soft bias layer, in an embodiment of the present invention.

Referring now to FIG. 4, thicknesses and magnetic moments of individual layers of the AFC soft bias structure 103 are illustrated. The thickness of soft bias layer 106 (SB1) is designated as t1, the thickness of soft bias layer 110 (SB2) is designated as t2, and the thickness of soft bias layer 114 (SB3) is designated as t3. The magnetic moments for each soft bias layer are illustrated with arrows. The magnetic moment of soft bias layer 110 (SB2) may be set antiparallel to the magnetic moment of soft bias layer 106 (SB1) and soft bias layer 114 (SB3) by setting the thicknesses of ruthenium layer (Ru1) 108 and ruthenium layer (Ru2) 112. The antiparallel magnetic moments are illustrated in the example by soft bias layer 110 (SB2) having an arrow pointing in an opposite direction as compared with the arrows of soft bias layer 106 (SB1) and soft bias layer 114 (SB3). Also, in an embodiment, the magnetic moment of soft bias layer 114 (SB3) may be established by setting the thicknesses of soft bias layer 106 (SB1) and soft bias layer 110 (SB2). By setting the thicknesses of soft bias layer 106 (SB1) and soft bias layer 110

(SB2), this allows a predetermined thickness of soft bias layer 114 (SB3) to be set. The magnetic moment of SB3 may be reduced by way of the antiparallel SB2 magnetic moment and the thicknesses of SB1 and SB2. As illustrated, in an embodiment of the invention, soft bias layer (SB1) 106 is set thicker than soft bias layer 110 (SB2), and soft bias layer 114 (SB3) is set thicker than soft bias layer 106 (SB1). In an embodiment of the invention, soft bias layer 106 (SB1) has a thickness in a range from 15 angstrom to 135 angstrom, soft bias layer 110 (SB2) has a thickness in a range from 10 angstrom to 60 angstrom, and soft bias layer 114 (SB3) has a thickness in a range from 30 angstrom to 300 angstrom.

Figure 5:
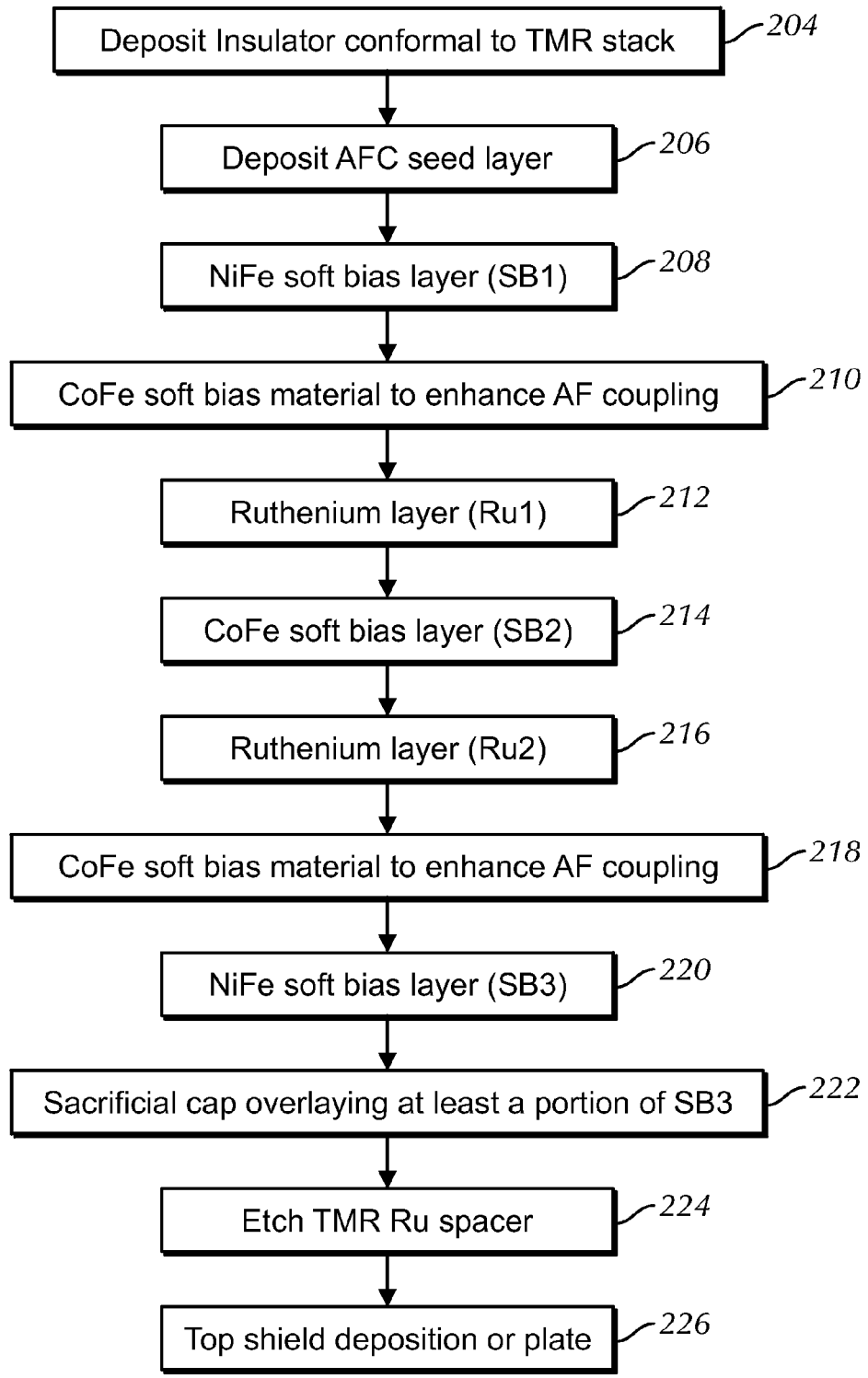
FIG. 5 is a method flow diagram illustrating a process of providing an antiferromagnetically-coupled (AFC) soft bias structure to be utilized with a magnetoresistive sensor of a magnetic read transducer, in an embodiment of the present invention.

FIG. 5 illustrates an example process of providing an AFC soft bias structure used to stabilize the free layer of the magnetoresistive sensor. The AFC soft bias structure is situated conformal to at least a portion of the side of the free layer that extends in the stripe height direction. Ion milling and adjustment of deposition angles can be utilized to obtain a conformal AFC soft bias structure. In the example shown, an insulator is deposited conformal to a TMR stack, as stated in step 204. An AFC seed layer is then deposited over the insulator, as stated in step 206. Next, a NiFe soft bias layer (SB1) is provided, as stated in step 208. A CoFe soft bias material may be then provided to enhance AF coupling, as stated in step 210. A ruthenium layer (Ru1) is then provided, as stated in step 212. A CoFe soft bias layer (SB2) is provided, as stated in step 214. A ruthenium layer (Ru2) is then provided, as stated in step 216. Next, a CoFe soft bias material may be provided to enhance AF coupling, as stated in step 218. A NiFe soft bias layer (SB3) is provided, as stated in step 220. A sacrificial cap may be provided overlaying at least a portion of SB3, as stated in step 222. Next, a TMR Ru spacer is etched, as stated in step 224. A top shield is provided by deposition or plate, as stated in step 226.

Turning now to representative graphs, experimental data is provided to illustrate comparisons of an example embodiment of the present invention and a hard bias design. Features of the discussion and claims are not limited to the example embodiment of the present invention, which is used only for purposes of the example data.

Figure 6:
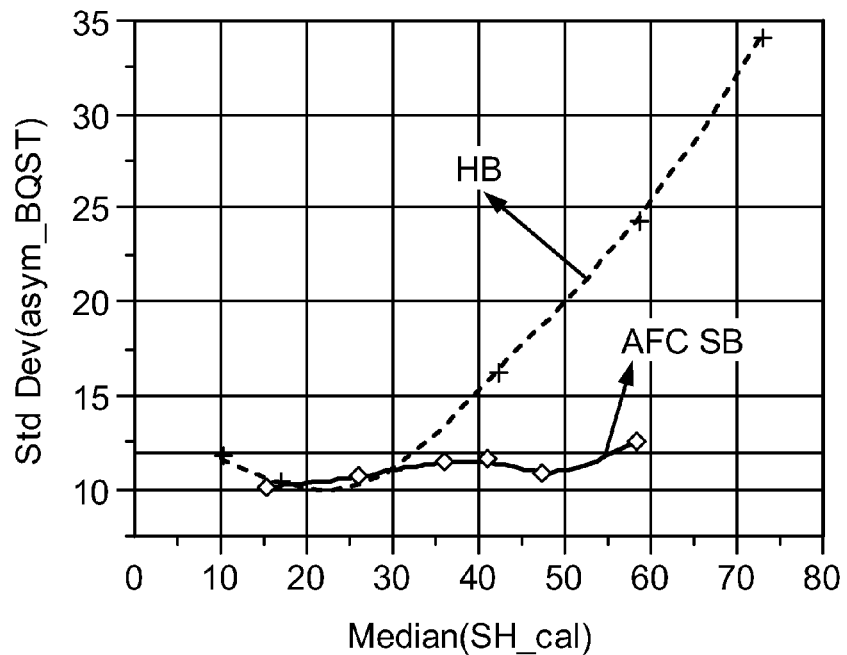
FIG. 6 is a representative graph illustrating experimental data showing asymmetry sigma across a stripe height range, for an embodiment of the present invention in comparison with a hard bias structure.

Referring to FIG. 6, a representative graph illustrates experimental data showing asymmetry sigma across a stripe height range, for an embodiment of the present invention in comparison with a hard bias structure. Stripe height may also be referred to as reader height. As shown, the hard bias design shows a greater increase in asymmetry sigma (or AASY) as compared to the AFC soft bias structure present invention embodiment. The higher AASY of the hard bias design is undesirable since it has a deleterious effect on the stability of the read head by causing a high bit error rate (BER) when the data is read back. In contrast, the AFC soft bias structure present invention embodiment maintains a consistently low and desirable AASY across a stripe height range. Moreover, the lower AASY of the AFC soft bias structure present invention embodiment allows greater margin and tolerance for writer nose length control during backend lapping processes.

Figure 7:
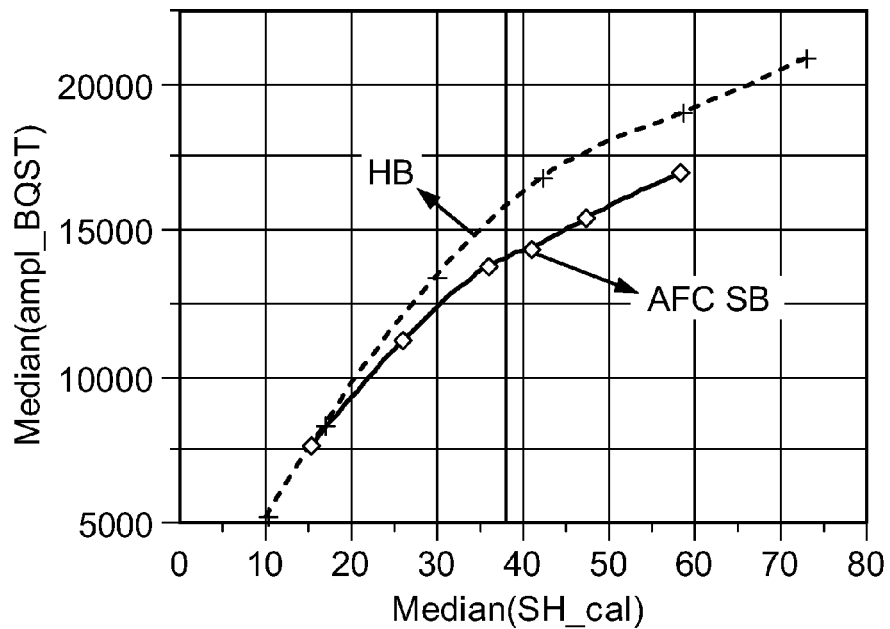
FIG. 7 is a representative graph illustrating experimental data of median reader amplitude versus stripe height for an embodiment of the present invention, and in comparison with a hard bias structure.
Figure 8:
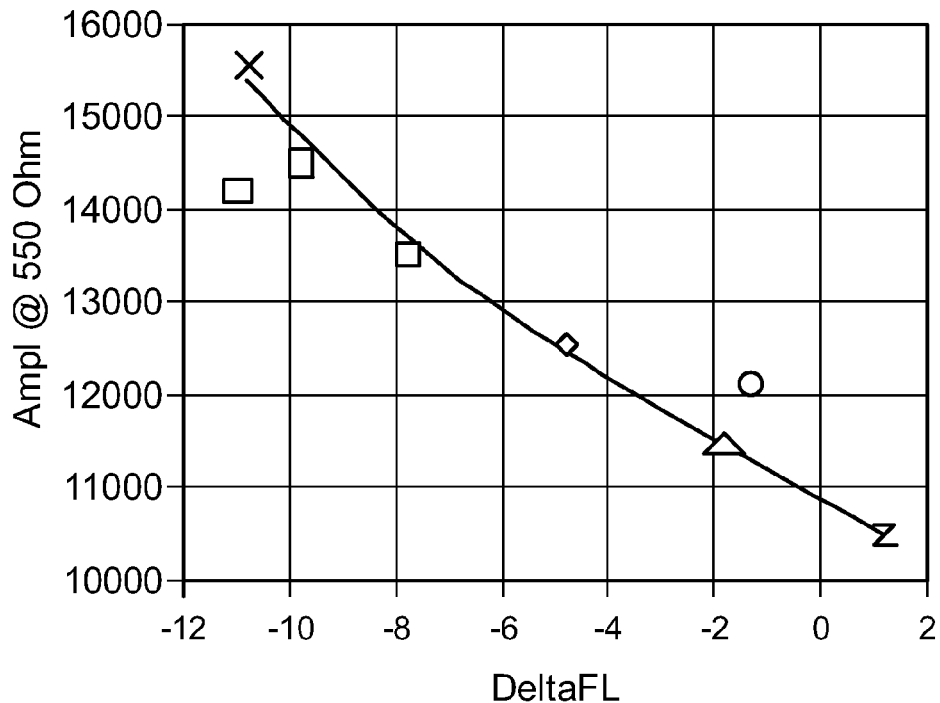
FIG. 8 is a representative graph illustrating experimental data of a change in reader amplitude with a change in vertical distance between a magnetoresistive sensor free layer and a second soft bias layer (SB2) of an AFC soft bias structure, in accordance with an embodiment of the present invention.

FIG. 7 illustrates experimental data of median reader amplitude versus stripe height for an embodiment of the present invention, and in comparison with a hard bias structure. Proper reader amplitude is especially important with the demand for increased areal density recording. In an embodiment of the invention, reader amplitude is changed by about 50% by tuning the vertical distance (shown as Delta FL) between the sensor free layer and SB2. FIG. 8 illustrates experimental data of a change in reader amplitude with a change in vertical distance between a magnetoresistive sensor free layer and a second soft bias layer (SB2) of an AFC soft bias structure embodiment of the present invention.

Figure 9:
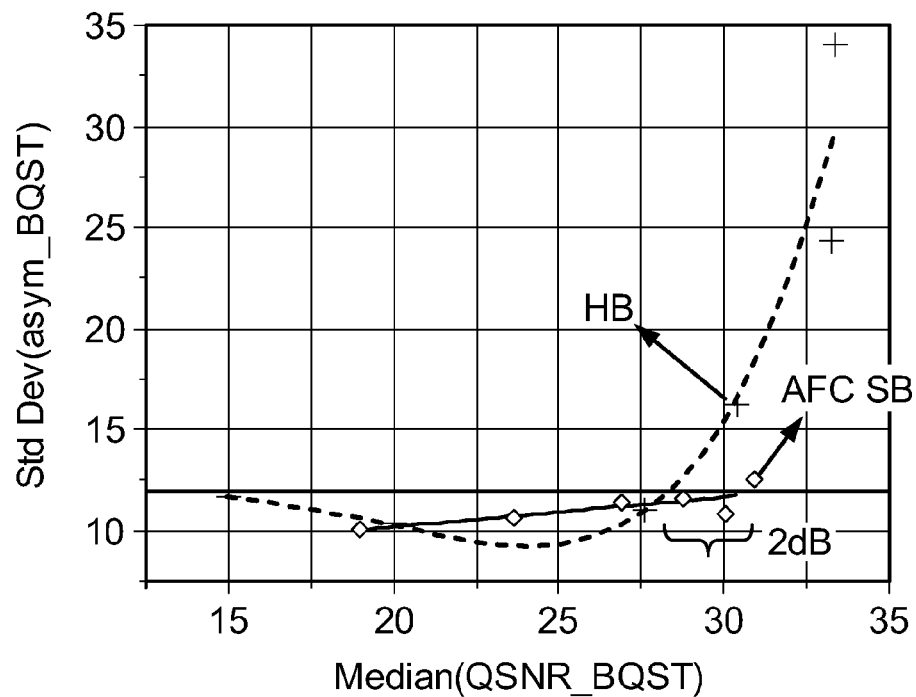
FIG. 9 is a representative graph illustrating experimental data of standard deviation of reader amplitude asymmetry showing QSNR capability, for an embodiment of the present invention, in comparison with a hard bias structure.

Experimental data of quantization signal-to-noise ratio (QSNR) capability is illustrated in FIG. 9, for an embodiment of the present invention, in comparison with a hard bias structure. As illustrated, an embodiment of the invention provides a higher QSNR capability than contemporary hard bias designs. The AFC soft bias present invention embodiment shows a QSNR capability of 31 dB at 12% asymmetry sigma, which is about 2 dB higher than the hard bias design.

Figure 10:
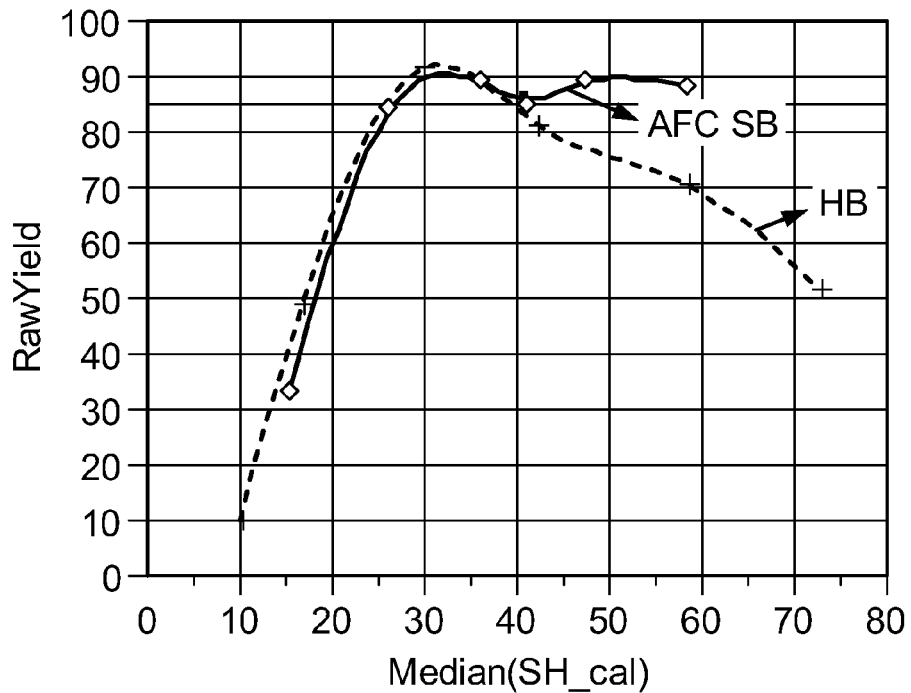
FIG. 10 is a representative graph illustrating experimental data of reader amplitude yield across a stripe height range, for an embodiment of the present invention, in comparison with a hard bias structure.

Additionally, an AFC soft bias present invention embodiment exhibits a consistently high reader amplitude yield across wide stripe height ranges such as from 25 nm to greater than 60 nm. FIG. 10 illustrates experimental data of reader amplitude yield across a stripe height range, for an embodiment of the present invention, in comparison with a hard bias structure.

Figure 11:
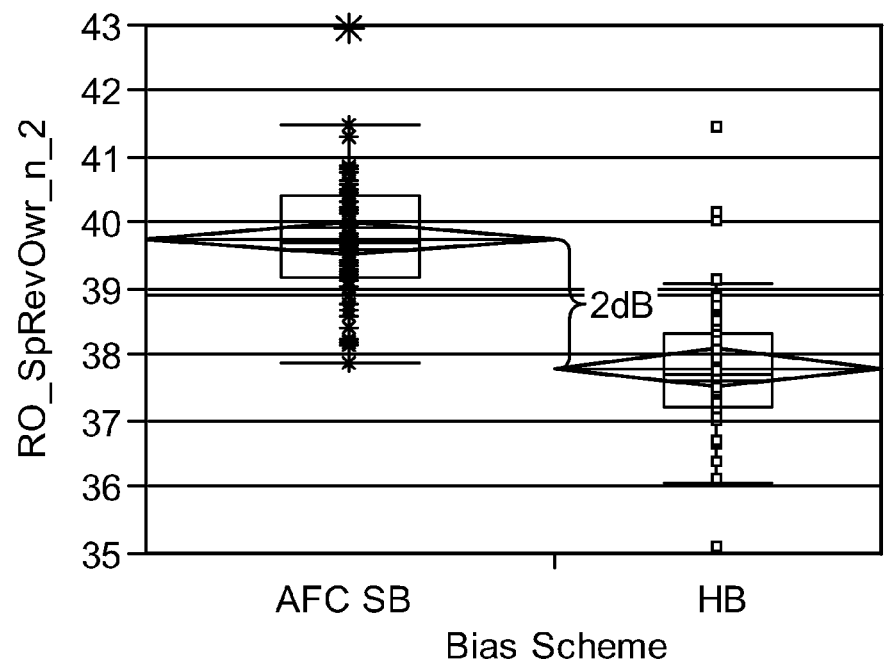
FIG. 11 is a representative graph illustrating experimental data of reverse overwrite for an embodiment of the present invention, in comparison with a hard bias structure.

FIG. 11 illustrates experimental data of reverse overwrite for an embodiment of the present invention, in comparison with a hard bias design. As shown, an embodiment of the invention exhibits a higher reverse overwrite by about 2 dB, in addition to reader microtrack width, in comparison with a hard bias design.

Modifications and variations may be made to the disclosed embodiments while remaining within the spirit and scope of the invention. The implementations described above and other implementations are within the scope of the following claims.

We claim:

1. A magnetic read transducer including an air-bearing surface (ABS) comprising:
   a magnetoresistive sensor including a free layer, the free layer including a first edge in a track width direction along the ABS; and
   an antiferromagnetically-coupled (AFC) soft bias layer;
   wherein at least a portion of the AFC soft bias layer is: a.) conformal to at least a portion of a second edge of the free layer, and b.) situated to form a magnetic moment at an angle with respect to a center line of the free layer, wherein the center line extends in the same direction as the free layer first edge that is in the track width direction along the ABS, the angle being nonzero.

2. The magnetic read transducer as in claim 1, wherein the magnetoresistive sensor is a tunneling magnetoresistive (TMR) sensor or a giant magnetoresistive (GMR) sensor.

3. The magnetic read transducer as in claim 1, wherein the AFC soft bias layer includes a first soft bias layer (SB1), a second soft bias layer (SB2), and a third soft bias layer (SB3), wherein SB1 is situated to form a magnetic moment that is reverse of a magnetic moment of SB2, and wherein SB3 is situated to form a magnetic moment that is reverse of the magnetic moment of SB2.

4. The magnetic read transducer as in claim 3, wherein SB1 is closer to the free layer than SB2, SB2 is closer to the free layer than SB3, SB1 is thicker than SB2, and SB3 is thicker than SB1.

5. The magnetic read transducer as in claim 3, further comprising a first ruthenium (Ru) layer situated between SB1 and SB2, and a second Ru layer situated between SB2 and SB3.

6. The magnetic read transducer as in claim 5, wherein the first Ru layer and the second Ru layer are a thickness such that the magnetic moment of SB2 is antiparallel to the magnetic moment of SB1 and SB3.

7. The magnetic read transducer as in claim 3, wherein SB1 and SB2 are a thickness that allow a predetermined thickness of SB3 to be set, such that a predetermined magnetic moment of SB3 is established.

8. The magnetic read transducer as in claim 3, wherein at least one of SB1, SB2, and SB3 is a CoFe-based soft magnetic material.

9. The magnetic read transducer as in claim 3, wherein SB1 is NiFe and CoFe, SB2 is CoFe, and SB3 is CoFe and NiFe.

10. The magnetic read transducer as in claim 3, wherein at least one of SB1, SB2 and SB3 is multilayered with nickel iron (NiFe) and cobalt iron (CoFe).

11. The magnetic read transducer as in claim 3, wherein SB1 has a thickness in a range from 15 angstrom to 135 angstrom, SB2 has a thickness in a range from 10 angstrom to 60 angstrom, and SB3 has a thickness in a range from 30 angstrom to 300 angstrom.

12. The magnetic read transducer as in claim 3, further comprising a sacrificial cap overlaying a portion of SB3 for chemical mechanical planarization (CMP), wherein SB3 is microstructurally and magnetically coupled to a top shield.

13. The magnetic read transducer as in claim 1, further comprising an insulator situated between the AFC soft bias layer and the second edge of the free layer, wherein the insulator is conformal to the second edge of the free layer.

14. The magnetic read transducer as in claim 1, further comprising a second AFC soft bias layer, wherein at least a portion of the second AFC soft bias layer is conformal to at least a portion of a third edge of the free layer, and wherein at least a portion of the second AFC soft bias layer is situated to form a magnetic moment at an angle with respect to the center line of the free layer.

15. The magnetic read transducer as in claim 1, wherein the magnetic read transducer is a component of a slider, and wherein the slider and a media are elements of a disk drive.

16. A method for providing a magnetic read transducer including an air-bearing surface (ABS) comprising:
    providing a magnetoresistive sensor including a free layer, the free layer including a first edge in a track width direction along the ABS; and
    providing, at a second edge of the free layer, a stack comprising, in overlaying sequence:
    a.) an insulator;
    b.) a soft bias seed layer; and
    c.) an antiferromagnetically-coupled (AFC) soft bias layer comprising, in overlaying sequence:
        i.) a first soft bias layer (SB1);
        ii.) a first ruthenium layer (Ru1);
        iii.) a second soft bias layer (SB2);
        iv.) a second ruthenium layer (Ru2); and
        v.) a third soft bias layer (SB3);
    wherein at least a portion of the AFC soft bias layer is: a.) conformal to at least a portion of the second edge of the free layer, and b.) situated to form a magnetic moment at an angle with respect to a center line of the free layer, wherein the center line extends in the same direction as the first edge of the free layer that is in the track width direction along the ABS, the angle being nonzero.

17. The method as in claim 16, wherein SB1 comprises nickel iron (NiFe), SB2 comprises cobalt iron (CoFe), and SB3 comprises NiFe.

18. The method as in claim 16, further comprising, providing, at least one of:
    i.) a soft bias material for enhancing AF coupling, comprising CoFe, situated between SB1 and Ru1;
    ii.) a second soft bias material for enhancing AF coupling, comprising CoFe, situated between Ru2 and SB3; and
    iii.) a sacrificial cap overlaying a portion of SB3 for chemical mechanical planarization (CMP), and microstructurally and magnetically coupling SB3 to a top shield.

19. The method as in claim 16, wherein SB1 is situated to form a magnetic moment that is reverse of a magnetic moment of SB2, and wherein SB3 is situated to form a magnetic moment that is reverse of the magnetic moment of SB2.

20. The method as in claim 16, further comprising allowing a predetermined thickness of SB3 to be set and establishing a magnetic moment of SB3, by setting a thickness of SB1 and SB2.

21. The method as in claim 16, wherein SB1 is thicker than SB2, and SB3 is thicker than SB1.

22. A method of stabilizing a magnetoresistive free layer in a magnetic read transducer including an air-bearing surface (ABS), wherein the free layer includes a first edge in a track width direction along the ABS, the method comprising magnetically biasing the free layer with an antiferromagnetically-coupled (AFC) soft bias layer, wherein at least a portion of the AFC soft bias layer is a.) conformal to at least a portion of a second edge of the free layer, and b.) situated to form a magnetic moment at an angle with respect to a center line of the free layer, wherein the center line extends in the same direction as the first edge of the free layer that is in the track width direction along the ABS, the angle being nonzero.

23. The method as in claim 22, wherein the AFC soft bias layer includes a first soft bias layer (SB1), a second soft bias layer (SB2), and a third soft bias layer (SB3), and further comprising situating SB1 to form a magnetic moment that is reverse of a magnetic moment of SB2, and situating SB3 to form a magnetic moment that is reverse of the magnetic moment of SB2.

24. The method as in claim 23, further comprising situating SB1 closer to the free layer than SB2, situating SB2 closer to the free layer than SB3, setting SB1 thicker than SB2, and setting SB3 thicker than SB1.

25. The method as in claim 23, further comprising establishing reader amplitude by setting a vertical distance between the free layer and SB2.

* * * * *